(12) United States Patent
Park et al.

(10) Patent No.: US 7,875,491 B2
(45) Date of Patent: Jan. 25, 2011

(54) CMOS IMAGE SENSORS AND METHODS OF MANUFACTURING THE SAME

(75) Inventors: Doo-cheol Park, Suwon-si (KR); Jung-hyeon Kim, Hwaseong-si (KR); Jun-young Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 92 days.

(21) Appl. No.: 12/010,349

(22) Filed: Jan. 24, 2008

(65) Prior Publication Data

US 2009/0179239 A1    Jul. 16, 2009

(30) Foreign Application Priority Data

Feb. 13, 2007    (KR) ...................... 10-2007-0015093

(51) Int. Cl.
*H01L 21/00* (2006.01)
(52) U.S. Cl. .............................. 438/75; 438/59; 438/69; 438/73; 438/199; 438/200; 257/222; 257/232; 257/290; 257/291; 257/292; 257/E21.131
(58) Field of Classification Search .................. 257/219
See application file for complete search history.

(56) References Cited

U.S. PATENT DOCUMENTS 5,272,355 A * 12/1993 Namavar et al. ................ 257/3
6,943,070 B2    9/2005 Yang
2003/0096443 A1*  5/2003 Hwang ........................ 438/59
2007/0158710 A1*  7/2007 Mheen et al. ................ 257/291

FOREIGN PATENT DOCUMENTS

| JP | 08-088396 | 4/1996 |
| KR | 1020000048110 | 7/2000 |
| KR | 1020030044333 | 6/2003 |

* cited by examiner

*Primary Examiner*—Zandra Smith
*Assistant Examiner*—Kyoung Lee
(74) *Attorney, Agent, or Firm*—Harness, Dickey & Pierce, P.L.C.

(57) ABSTRACT

A complementary metal-oxide-semiconductor image sensor may include: a semiconductor substrate; a photodiode formed on a first portion of the semiconductor substrate; a transfer gate formed on the semiconductor substrate, near the photodiode, to transfer optical charges accumulated in the photodiode; a floating diffusion area formed on a second portion of the semiconductor substrate, on an opposite side of the transfer gate from the photodiode, to accommodate the optical charges; and/or a channel area formed under the transfer gate and contacting a side of the photodiode to transfer the optical charges. The transfer gate may be formed, at least in part, of transparent material. A method of manufacturing a complimentary metal-oxide-semiconductor image sensor may include: forming the photodiode; forming the floating diffusion area, separate from the photodiode; and/or forming the transfer gate, near the photodiode, to transfer optical charges accumulated in the photodiode.

20 Claims, 7 Drawing Sheets

CMOS IMAGE SENSORS AND METHODS OF MANUFACTURING THE SAME

PRIORITY STATEMENT

This application claims priority from Korean Patent Application No. 10-2007-0015093, filed on Feb. 13, 2007, in the Korean Intellectual Property Office (KIPO), the entire contents of which are incorporated herein by reference.

BACKGROUND

1. Field

Example embodiments relate to complementary metal-oxide-semiconductor (CMOS) image sensors and methods of manufacturing the same. Also, example embodiments relate to image sensors comprising transfer gates formed of transparent material and methods of manufacturing the same.

2. Description of Related Art

Photodiodes (PDs) are light receiving devices that convert optical signals into electrical signals. PDs are widely used in optical pickup apparatuses such as compact disk read only memories (CD-ROMs), digital versatile discs (DVDs), or the like or optical communications, etc. If light is incident onto such a PD, pairs of electrons and holes are generated in a depletion area. The pairs of electrons and holes are transmitted through a gate or a wire line connected to an outside environment. In other words, an amount of a current flowing in a PD varies with an optical generation rate of carriers. The current functions to convert a temporally varying optical signal into an electrical signal.

An image sensor, e.g., a CMOS image sensor (CIS), generally can be divided into a photo sensing area and a peripheral area. The photo sensing area includes a plurality of unit pixels, each of which includes a plurality of gates having a PD and a transfer gate. The plurality of gates transmits a current generated by the PD to the peripheral area. The peripheral area converts the current transmitted from the photo sensing area into a digital signal through a plurality of circuits to obtain image information.

Figure 1A:
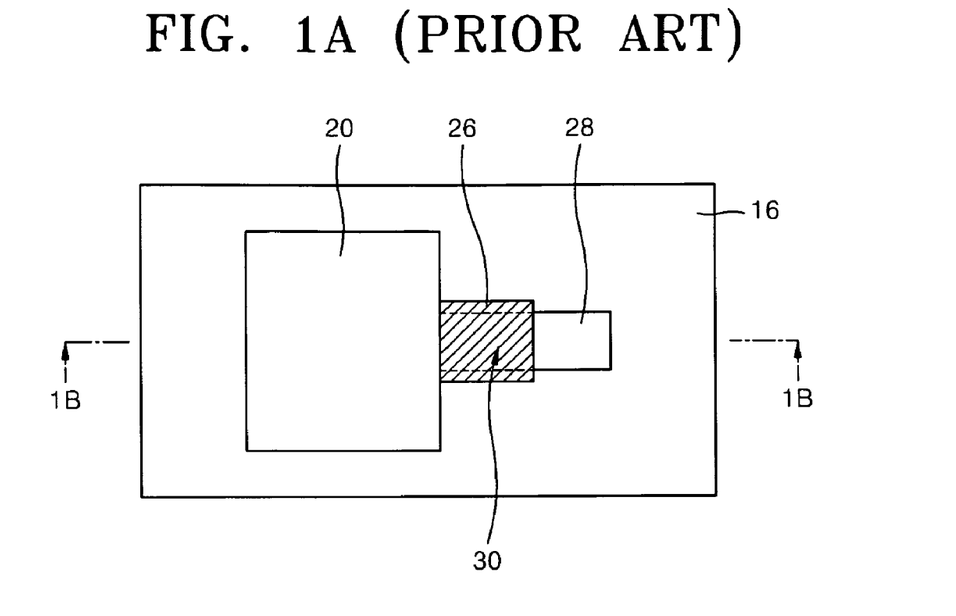
FIG. 1A is a plan view of a related art image sensor including a transfer gate.
Figure 1B:
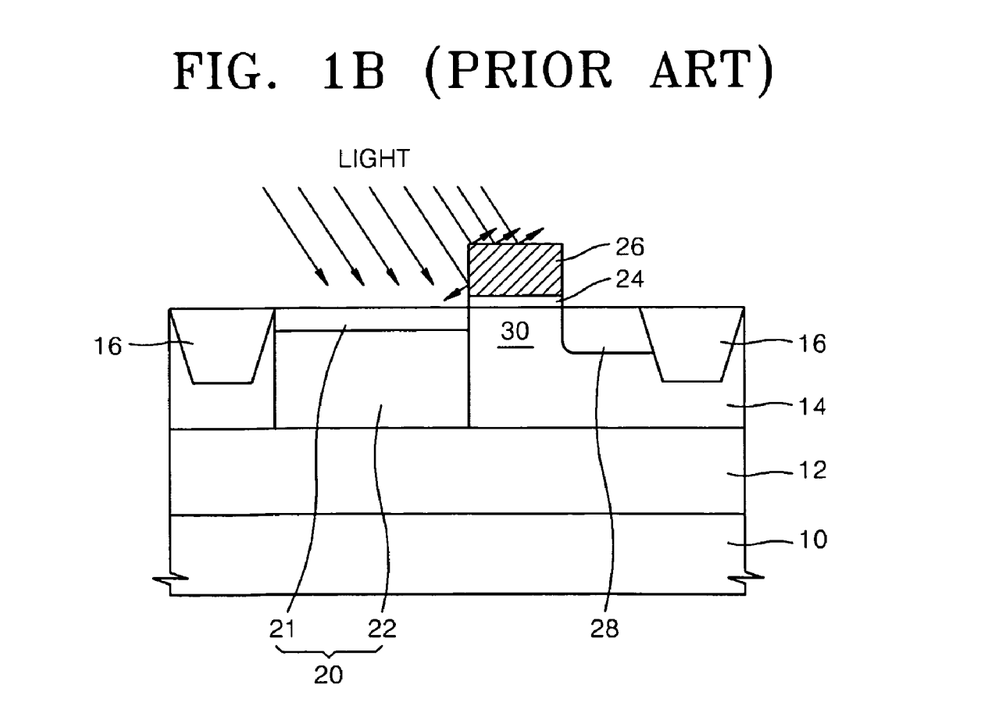
FIG. 1B is a cross-sectional view taken along line 1B-1B of FIG. 1A.

FIG. 1A is a plan view of a related art image sensor including a transfer gate, and FIG. 1B is a cross-sectional view taken along line 1B-1B of FIG. 1A. Referring to FIGS. 1A and 1B, the related art image sensor includes a PD 20 that is formed above a semiconductor substrate 10 and is isolated by an isolation layer 16. First and second p-wells 12 and 14 are sequentially disposed on the semiconductor substrate 10. Here, ions are injected into the first p-well 12 at higher density, and ions are injected into the second p-well 14 at lower density. The PD 20 generally includes a p-type PD 21 and an n-type PD 22. A transfer gate 26 is formed on a gate insulating layer 24 and transfers optical charges generated in the PD 20 to a floating diffusion area 28 through a channel area 30 of the semiconductor substrate 10.

The amount of generated optical charge is defined as sensitivity with respect to the amount of incident light. The sensitivity is affected by a numerical aperture (NA), thicknesses of layers, potential of a substrate, etc. However, the sensitivity is reduced due to a reduction in a design rule for reducing size of a unit pixel. Thus, sensitivity is required to be improved due to the reduction of size of the PD 20 resulting from the reduction of size of the unit pixel.

SUMMARY

Example embodiments may provide complementary metal-oxide-semiconductor (CMOS) image sensors (CIS) capable of improving an amount of generated optical charge with respect to an amount of incident light in spite of a reduction in size of a photodiode (PD) and methods of manufacturing the CIS.

According to example embodiments, a complementary metal-oxide-semiconductor image sensor may include: a semiconductor substrate; a photodiode formed on a first portion of the semiconductor substrate; a transfer gate formed on the semiconductor substrate, near the photodiode, to transfer optical charges accumulated in the photodiode; a floating diffusion area formed on a second portion of the semiconductor substrate, on an opposite side of the transfer gate from the photodiode, to accommodate the optical charges; and/or a channel area formed under the transfer gate and contacting a side of the photodiode to transfer the optical charges. The transfer gate may be formed, at least in part, of transparent material.

According to example embodiments, a method of manufacturing a complimentary metal-oxide-semiconductor image sensor may include: forming a photodiode on a first portion of a semiconductor substrate; forming a floating diffusion area on a second portion of the semiconductor substrate, separate from the photodiode; and/or forming a transfer gate on the semiconductor substrate, near the photodiode, to transfer optical charges accumulated in the photodiode. The floating diffusion area may accommodate the optical charges. The transfer gate may be formed, at least in part, of transparent material

BRIEF DESCRIPTION OF THE DRAWINGS

The above and/or other aspects and advantages will become more apparent and more readily appreciated from the following detailed description of example embodiments taken in conjunction with the accompanying drawings, in which.

DETAILED DESCRIPTION OF EXAMPLE EMBODIMENTS

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions are exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Example embodiments may provide complementary metal-oxide-semiconductor (CMOS) image sensors (CIS) using a transparent transfer gate and methods of manufacturing the CIS. A transparent transfer gate or a portion of a transparent transfer gate may be formed of transparent material. Thus, example embodiments may be differentially described according to the structure(s) of the transfer gate or gates.

Figure 2A:
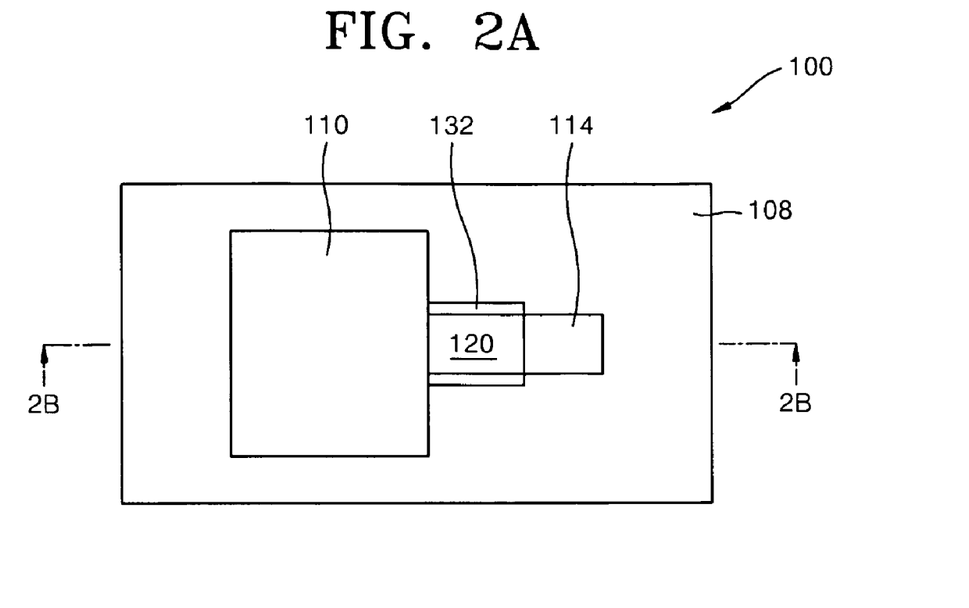
FIG. 2A is a plan view of an image sensor including a transfer gate according to example embodiments.
Figure 2B:
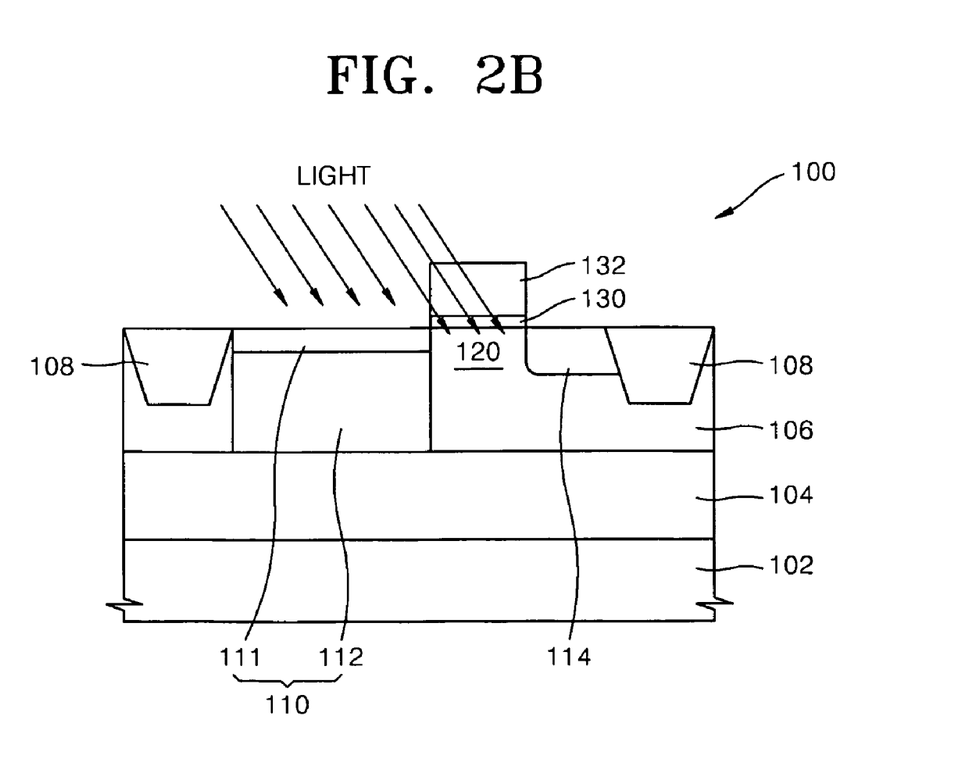
FIG. 2B is a cross-sectional view taken along line 2B-2B of FIG. 2A.

FIG. 2A is a plan view of an image sensor 100 including a transfer gate 132 according to example embodiments, and FIG. 2B is a cross-sectional view taken along line 2B-2B of FIG. 2A. Referring to FIGS. 2A and 2B, image sensor 100 may include photodiode (PD) 110 formed above semiconductor substrate 102. PD 110 may be isolated, for example, by isolation layer 108. First and second p-wells 104 and 106 may be sequentially disposed on semiconductor substrate 102. For example, ions may be injected to first p-well 104 at higher density, and/or ions may be injected into second p-well 106 at lower density. PD 110 may include p-type PD 111 and/or n-type PD 112. Transfer gate 132 may be formed on gate insulating layer 130 and/or may transfer generated optical charges in PD 110 to floating diffusion area 114 through, for example, channel area 120 of semiconductor substrate 102.

Transfer gate 132 according to example embodiments may be formed, for example, of transparent material. The transparent material may comprise one or more of a nitride comprising a Group 13 element, an oxide comprising a Group 10 element, an oxide comprising a Group 12 element, a compound comprising Group 12 and Group 16 element, indium tin oxide (ITO), and silica (SiC). Here, the above-mentioned elements belong to the Periodic Table of the Elements (PTOTE).

The nitride comprising the Group 13 element may include, for example, one or more of aluminum (Al), indium (In), and gallium (Ga). For example, the nitride may comprise GaN, AlGaN, InGaN, AlInGaN, or the like. The oxide comprising the Group 10 element and/or Group 12 element may include, for example, one or both of zinc (Zn) and nickel (Ni). For example, the oxide may comprise ZnO, NiO, ZnAlGaO, or the like. The compound comprising the Group 12 and Group 16 elements may include, for example, ZnSe, ZnTe, ZnS and CdS.

If transfer gate 132 is formed, at least in part, of the transparent material, light may permeate transfer gate 132 and/or then may reach channel area 120 of semiconductor substrate 102. The light having reached channel area 120 may generate optical charges in channel area 120. The generated optical charges may be accumulated in p-type PD 111. In other words, according to example embodiments, channel area 120 may be used as an area generating optical charges. Thus, areas capable of generating optical charges through light may be increased to increase an amount of generated optical charge in spite of a reduction of size of a unit pixel, so as to improve sensitivity.

Figure 3:
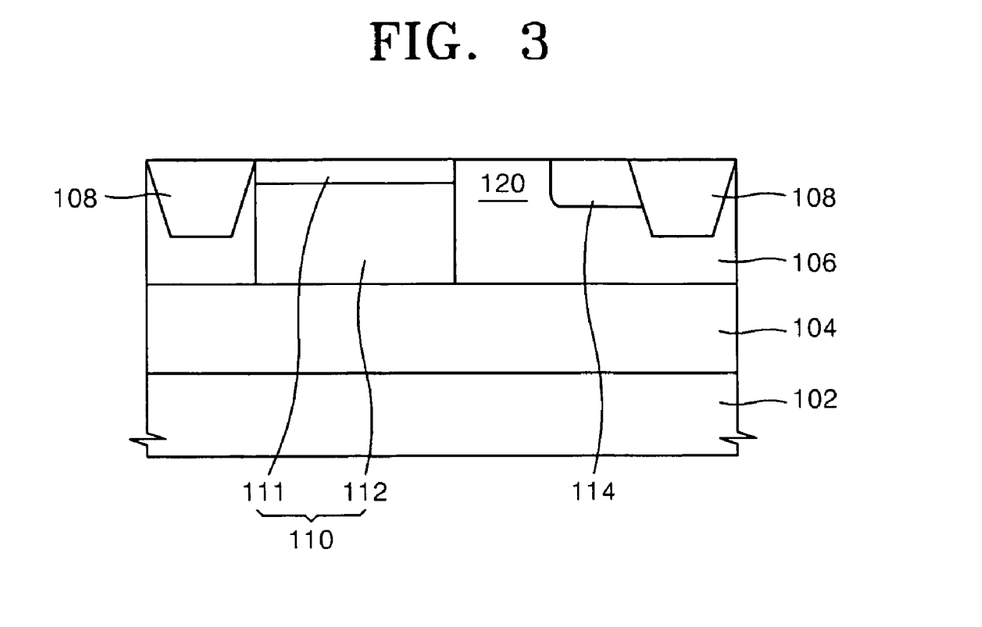
FIGS. 3 through 5 are cross-sectional views illustrating a method of manufacturing an image sensor according to example embodiments.
Figure 4:
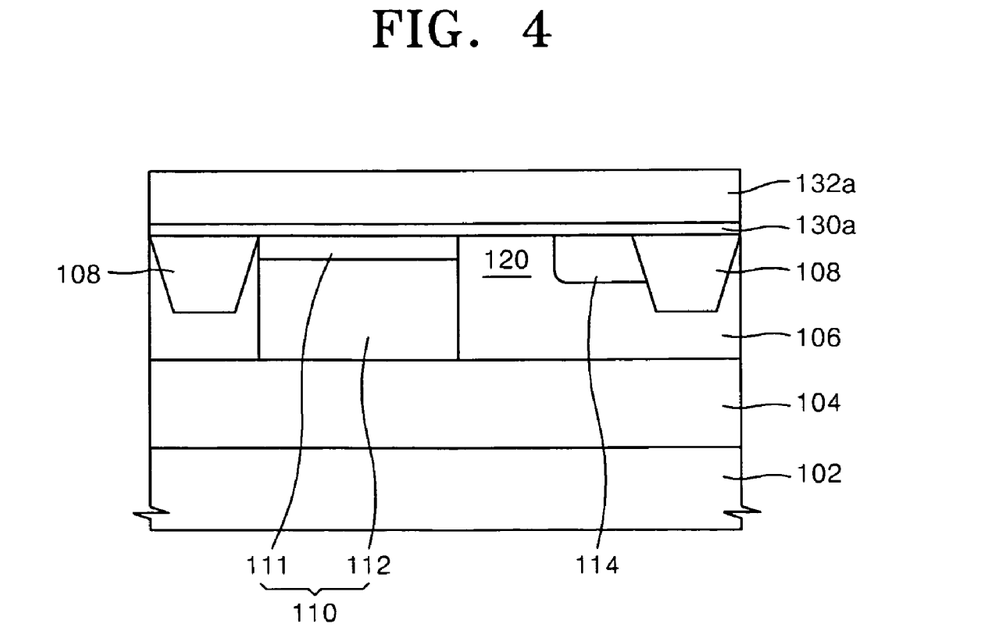
Figure 5:
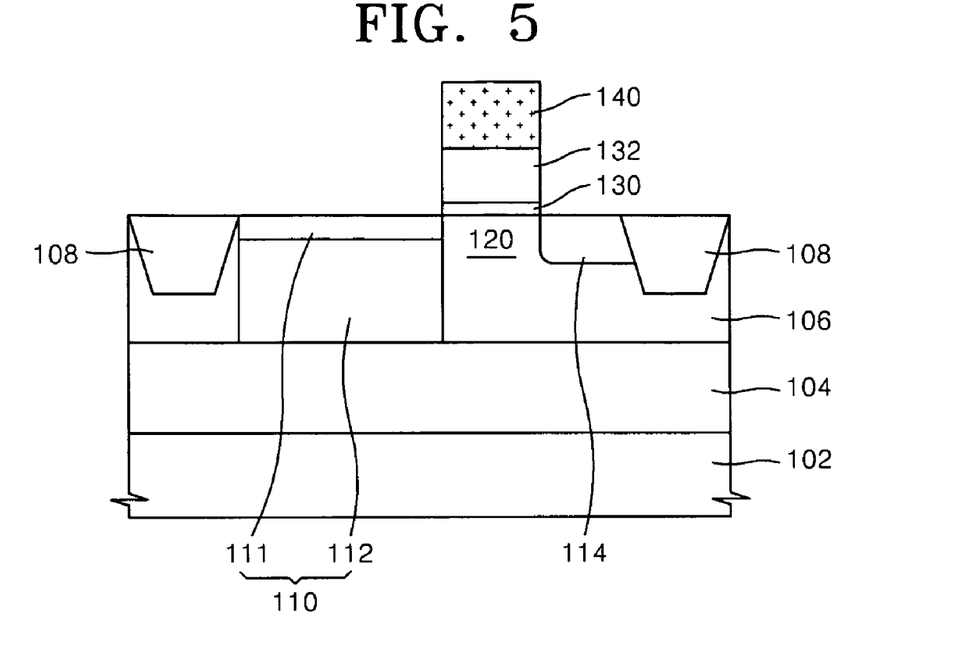

FIGS. 3 through 5 are cross-sectional views illustrating a method of manufacturing image sensor 100 according to example embodiments. Referring to FIG. 3, higher density p-type dopant may be injected into semiconductor substrate 102, e.g., an n-type silicon substrate, to form first p-well 104. First p-well 104 may reduce resistance to movement of carriers. Second p-well 106, having a lower density, may be formed on first p-well 104 to a thickness that may or may not be predetermined. The thickness and resistivity of second p-well 106 may affect energy conversion efficiency and/or signal processing velocity of PD 110. The thickness of second p-well 106 may be, for example, greater than or equal to about 8 μm and less than or equal to about 12 μm, and/or the resistivity of second p-well 106 may be, for example, greater than or equal to about 100 Ω-cm and less than or equal to about 200 φ-cm.

PD 110, including p-type and n-type PDs 111 and 112, may be formed near isolation layer 108 (for example, p-type PD 111 and/or n-type PD 112 may be beside isolation layer 108). N-type dopant, e.g., arsenic (As) may be injected and/or then may be activated to form n-type PD 112. P-type dopant, e.g., boron (B), may be injected and/or then may be activated to form p-type PD 111.

Floating diffusion area 114 may be formed in an upper portion of second p-well 106 between isolation layer 108 and PD 110. For example, floating diffusion area 114 may be isolated from PD 110 by a transfer gate that may be formed later.

Referring to FIG. 4, gate insulating layer material 130a and/or transparent transfer gate material 132a may be deposited on a portion of a surface or on the entire surface of semiconductor substrate 102 on which PD 110 and isolation layer 108 may be formed. Gate insulating layer material 130a may be a transparent material including $SiO_2$, $Hf_2O$, silicon nitride, silicon oxynitride, a ferroelectric material, or a combination of $SiO_2$, $Hf_2O$, silicon nitride, silicon oxnitride, and/or the ferroelectric material. The ferroelectric material may include, for example, barium strontium titanate, barium zirconate titanate, lead zirconate titanate, lead lanthanum titanate, strontium titanate, barium titanate, bismuth titanate, strontium bismuth titanate, strontium bismuth titanate niobate.

Transfer gate material 132a may comprise one or more of a nitride comprising a Group 13 element, an oxide comprising a Group 10 element, an oxide comprising a Group 12 element, a compound comprising Group 12 and Group 16 elements, ITO, and SiC. Here, the above-mentioned elements belong to the Periodic Table of the Elements.

The nitride may include, for example, one or more of Al, In, and Ga. For example, the nitride may comprise GaN, AlGaN, InGaN, AlInGaN, or the like. The oxide may include, for example, one or both of Zn and Ni. For example, the oxide may comprise ZnO, NiO, ZnAlGaO, or the like. The compound may include, for example, ZnSe, ZnTe, ZnS and CdS.

Many methods may be used to form the transfer gate material 132a. For example, transfer gate material 132a may be formed using one or more of molecular beam epitaxy (MBE), electronic beam (E-beam) evaporation, atomic layer epitaxy (ALE), pulsed laser deposition (PLD), chemical vapor deposition (CVD), Sol-Gel, and an atomic layer deposition method. If necessary, transfer gate material 132a may be doped with higher density dopant to improve conductivity of transfer gate material 132a.

Referring to FIG. 5, photoresist pattern 140 may be formed on transfer gate material 132a above second p-well 106, between PD 110 and floating diffusion area 114, to define transfer gate 132. Transfer gate material 132a and/or gate insulating layer material 130a may be etched in a shape of photoresist pattern 140 to form transfer gate 132 and/or gate insulating layer 130. Photoresist pattern 140 may be removed using a normal method to complete image sensor 100 of FIG. 2B.

Figure 6A:
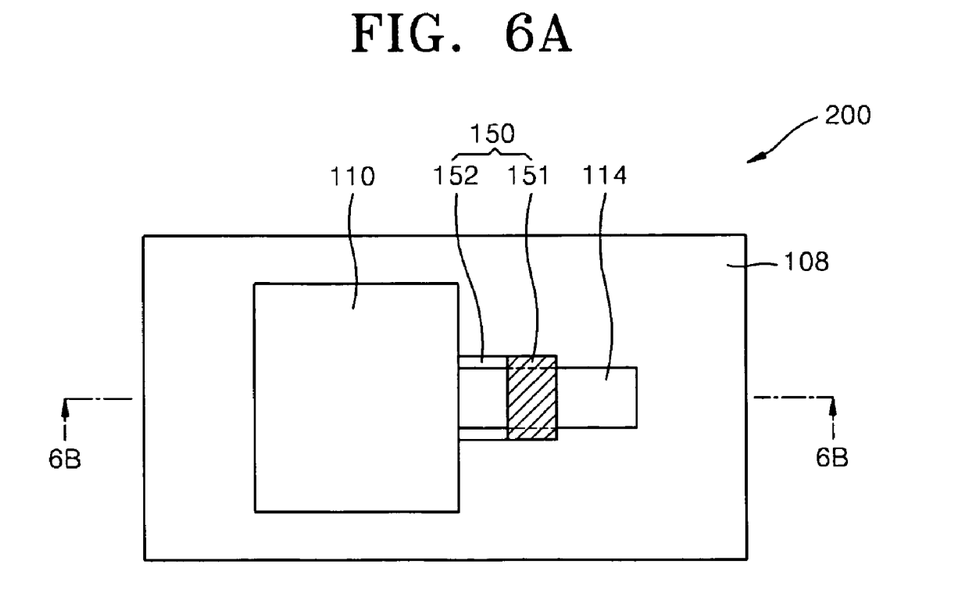
FIG. 6A is a plan view of an image sensor including a transfer gate according to example embodiments.
Figure 6B:
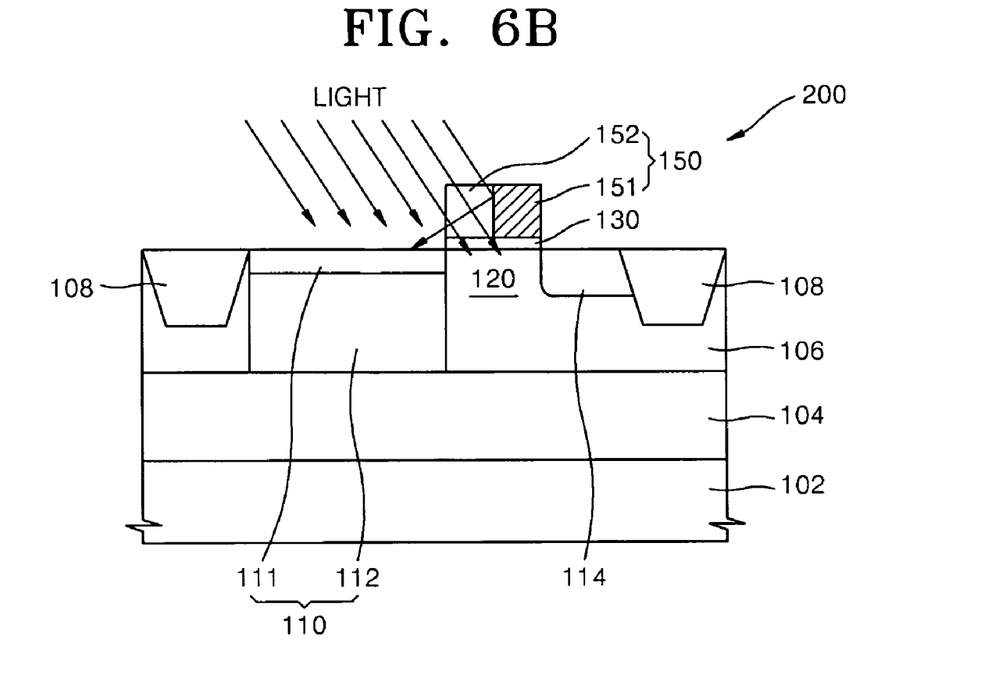
FIG. 6B is a cross-sectional view taken along line 6B-6B of FIG. 6A.

FIG. 6A is a plan view of an image sensor 200 including a transfer gate 150 according to example embodiments, and FIG. 6B is a cross-sectional view taken along line 6B-6B of FIG. 6A. For example, image sensor 200 may be similar to image sensor 100 described with reference to FIGS. 2A and 2B, except for transfer gate 150.

Referring to FIGS. 6A and 6B, image sensor 200 may include transfer gate 150, including transparent layer 152 and/or opaque layer 151. Transparent layer 152 may contact PD 110, opaque layer 151 may contact floating diffusion area 114, and/or transparent and opaque layers 152 and 151 may be connected to each other. Transparent layer 152 may be closer to PD 110 than opaque layer 151 and/or opaque layer 151 may be closer to floating diffusion area 114 than transparent layer 152.

Transparent layer 152 may be formed of a nitride comprising a Group 13 element, an oxide comprising a Group 10 element and/or a Group 12 element, a compound of Group 12 and Group 16 elements, ITO, or SiC. Here, the above-mentioned elements belong to the Periodic Table of the Elements.

The nitride may include, for example, one or more of Al, In, and Ga. For example, the nitride may comprise GaN, AlGaN, InGaN, AlInGan, or the like. The oxide may include, for example, one or both of Zn and Ni. For example, the oxide may comprise ZnO, NiO, ZnAlGaO, or the like. The compound may include ZnSe, ZnTe, ZnS and CdS.

In transfer gate 150 according to example embodiments, incident light may permeate transparent layer 152 and/or then may reach channel area 120. The light having reached channel area 120 may generate optical charges in channel area 120. A portion of light incident from an external source may be reflected from a side of opaque layer 151 toward channel area 120 and/or PD 110. Thus, a larger amount of light may be reflected toward PD 110.

The generated optical charges may be accumulated in p-type PD 111. In other words, channel area 120 may be used as an area generating optical charges. Thus, areas capable of generating optical charges may be increased due to light to increase an amount of generated optical charge so as to improve sensitivity in spite of a reduction of size of a unit pixel.

Figure 7:
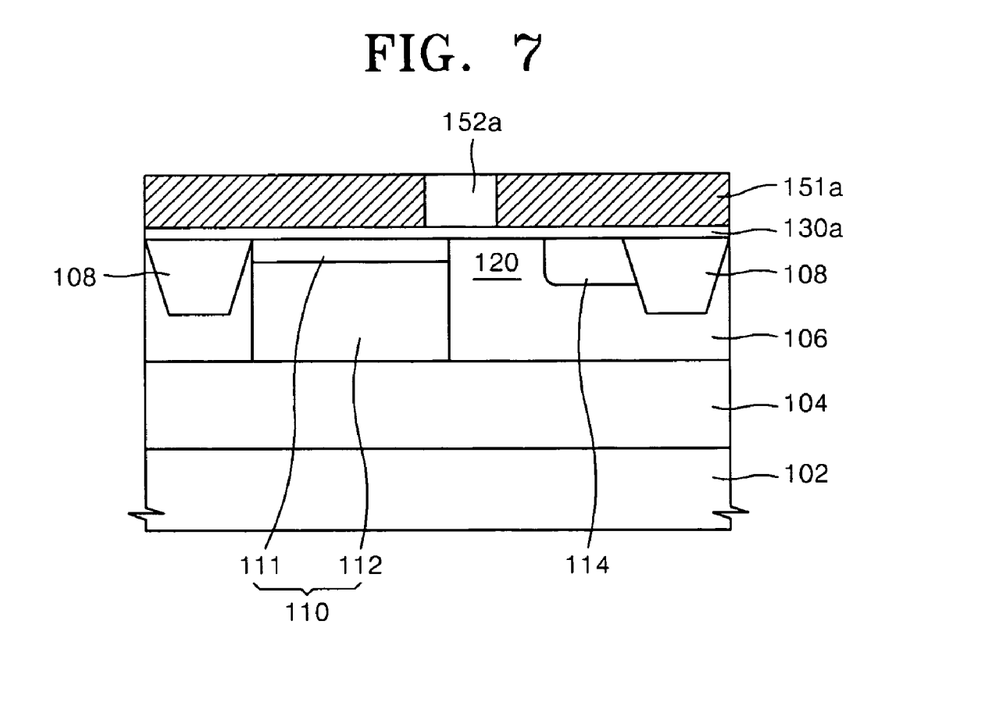
FIGS. 7 and 8 are cross-sectional views illustrating a method of manufacturing an image sensor according to example embodiments.
Figure 8:
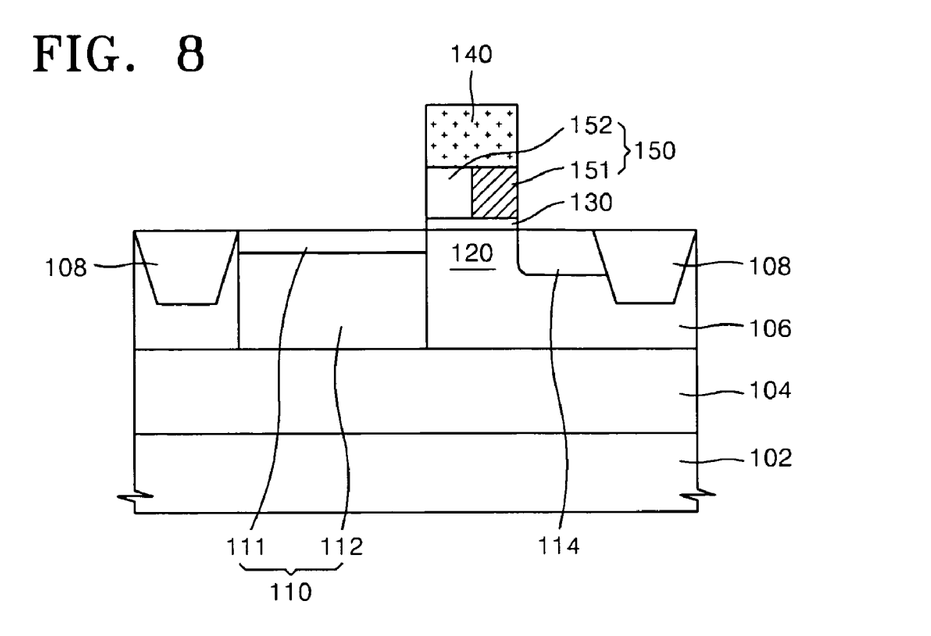

FIGS. 7 and 8 are cross-sectional views illustrating a method of manufacturing image sensor 200 according to example embodiments. For example, a semiconductor substrate 102 may comprise PD 110, isolation layer 108, and/or floating diffusion area 114, as described with reference to FIG. 3.

Referring to FIG. 7, gate insulating layer material 130a may be formed on an entire surface of semiconductor substrate 102 on which PD 110 and isolation layer 108 are formed. Transparent transfer gate material 152a and/or opaque transfer gate material 151a may be formed as a single layer to a similar thickness on gate insulating layer material 130a above a second p-well 106, between PD 110 and floating diffusion area 114.

For example, opaque transfer gate material 151a may be deposited on gate insulating layer material 130a. Next, opaque transfer gate material 151a, in which a transparent transfer gate 152 is to be formed, may be etched to expose gate insulating layer material 130a. Transparent transfer gate material 152a may be filled using the method(s) described with reference to FIG. 4 and/or then may be planarized to expose a surface of opaque transfer gate material 151a. For example, transparent transfer gate material 152a also may be formed above PD 110 to secure a process margin. Transparent transfer gate material 152a and/or opaque transfer gate material 151a may be doped with high density dopant to improve their conductivities.

In addition or in the alternative, transparent transfer gate material 152a may be deposited on gate insulating layer material 130a. Next, transparent transfer gate material 152a may be etched to expose gate insulating layer material 130a. Opaque transfer gate material 151a may be filled using the method(s) described with reference to FIG. 4 and/or then may be planarized to expose a surface of transparent transfer gate material 152a. For example, opaque transfer gate material 151a also may be formed above PD 110 to secure a process margin. Once again, transparent transfer gate material 152a and/or opaque transfer gate material 151*a* may be doped with high density dopant to improve their conductivities.

Opaque transfer gate material 151*a* may be formed of one or more of amorphous polysilicon, doped polysilicon, polycrystalline silicon-germanium, and material including a conductive metal. Opaque transfer gate material 151*a* may be formed as a single or compound layer. The material including the conductive metal may be a metal such as tungsten, molybdenum, or conductive metal nitride such as titanium nitride, tantalum nitride, or tungsten nitride.

Referring to FIG. 8, photoresist pattern 140 may be formed on transparent transfer gate material 152*a* and/or opaque transfer gate material 151*a* above second p-well 106 between PD 110 and floating diffusion area 114, in order to define transfer gate 150. Opaque transfer gate material 151*a*, transparent transfer gate material 152*a*, and/or gate insulating layer material 130*a* may be etched to form transfer gate 150 and/or gate insulating layer 130. Photoresist pattern 140 may be removed using a normal method to complete image sensor 200 of FIG. 6B.

Figure 9:
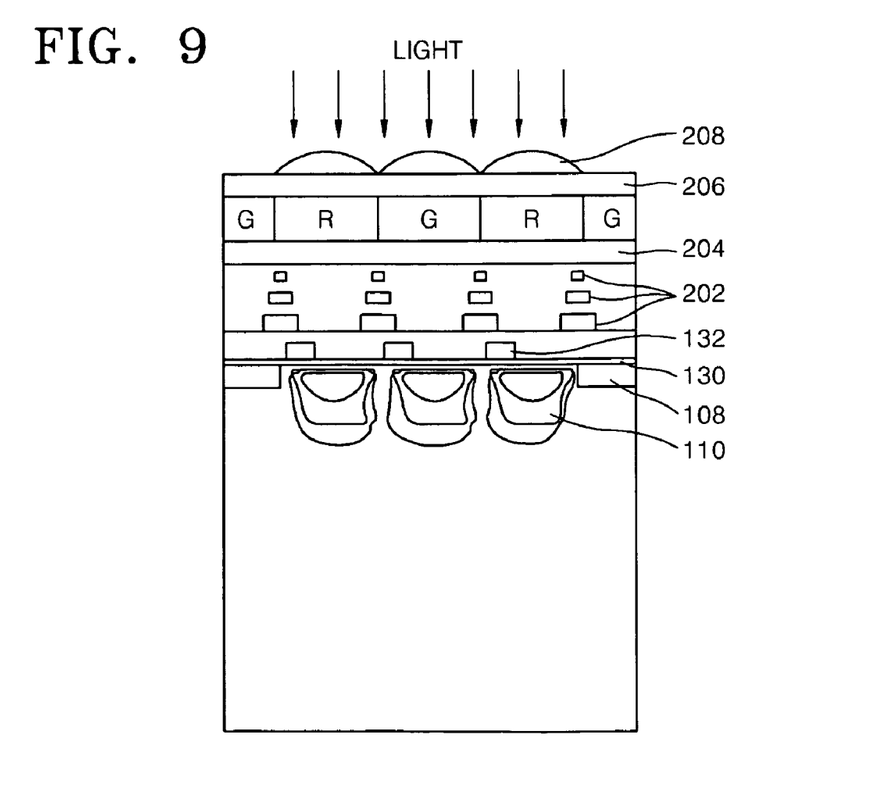
FIG. 9 is a schematic cross-sectional view of an image sensor including a lens to measure sensitivity of a transparent transfer gate with respect to a green (G) beam.
Figure 10:
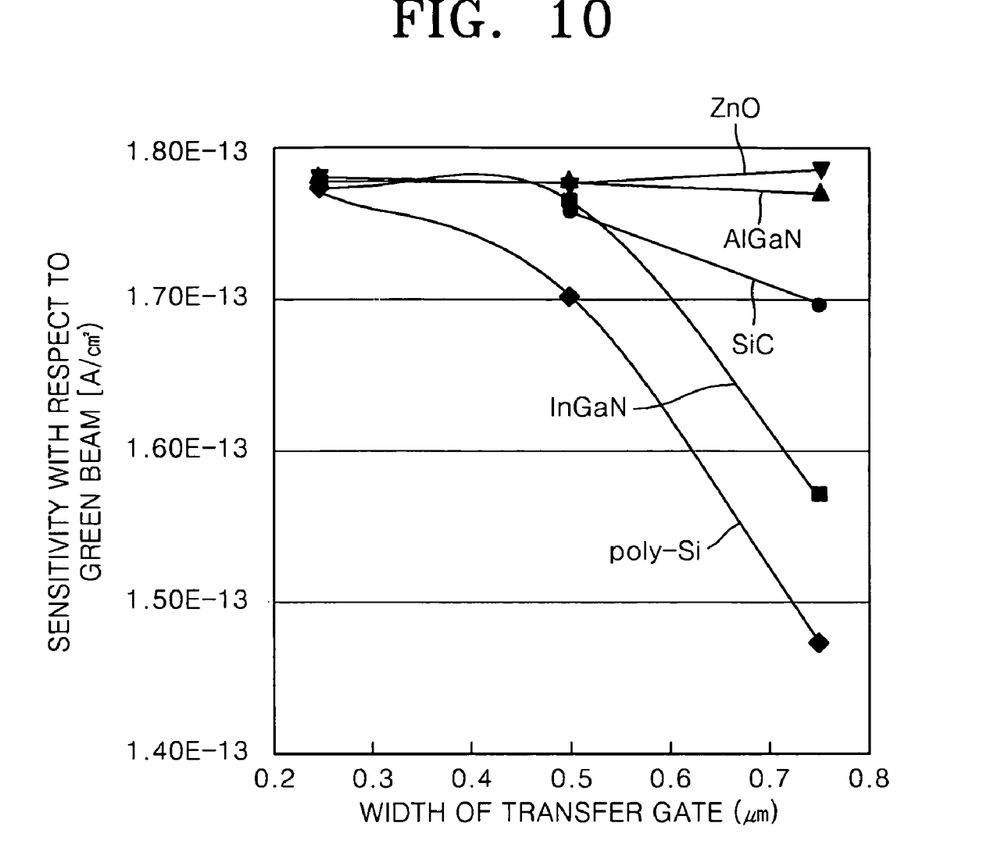
FIG. 10 is a graph illustrating sensitivity of a G beam measured using the image sensor of FIG. 9 with respect to a width of a transparent transfer gate.

FIG. 9 is a schematic cross-sectional view of an image sensor including a lens to measure sensitivity of a transparent transfer gate with respect to a green (G) beam, and FIG. 10 is a graph illustrating the sensitivity of the G beam measured using the image sensor of FIG. 9 with respect to a width of the transparent transfer gate. Here, transfer gate 132 of FIG. 2A may be adopted as the transparent transfer gate.

Referring to FIG. 9, interlayer insulating layer 204, including a plurality of shielding layer patterns 202, may be disposed on semiconductor substrate 102 on which transfer gates 132 are formed, to form color filters on interlayer insulating layer 204. Color filters having high sensitivities with respect to G and red (R) beams may be alternately disposed on interlayer insulating layer 204. Planarization layer 206 may be formed on the color filters. Micro lens 208 may be positioned on planarization layer 206 to focuses light onto PDs 110.

An experiment was performed to measure the sensitivity of the G beam using transfer gates 132. In the experiment, a light beam having a wavelength of about 500 nm was used as incident light. A width of each of transfer gates 132 was determined based on isolation layer 108. Thus, the great width of each of transfer gates 132 means that an area from isolation layer 108 to PDs 110 is great. The concept of the width may be applied to PD 110 under a color filter having high sensitivity with respect to the G beam.

Referring to FIG. 10, in a case of polysilicon, sensitivity with respect to the G beam may be remarkably decreased with increases of the widths of transfer gates 132. For example, if a width of a polysilicon is 0.5 μm, sensitivity of polysilicon may be reduced by about 5% compared to ZnO and/or AlGaN. If the width of the polysilicon is about 0.75 μm, the sensitivity of the polysilicon is reduced by about 20% compared to ZnO and/or AlGaN.

Sensitivity of ZnO or AlGaN with respect to the G beam is not reduced with an increase of the width of the transfer gate. If a width of SiC or InGaN exceeds 5 μm, for example, sensitivity of SiC and/or InGaN is gradually reduced.

As described above, in a CIS and a method of manufacturing the CIS according to example embodiments, areas capable of generating optical charges may be increased due to a transparent transfer gate. Thus, an amount of generated optical charge may be increased to improve sensitivity in spite of a reduction of a size of a unit pixel.

While example embodiments have been particularly shown and described, it will be understood by those of ordinary skill in the art that various changes in form and details may be made therein without departing from the spirit and scope of the present invention as defined by the following claims.

What is claimed is:

1. A complementary metal-oxide-semiconductor image sensor, comprising:
   a semiconductor substrate;
   a photodiode formed on a first portion of the semiconductor substrate;
   a transfer gate formed on the semiconductor substrate, near the photodiode, to transfer optical charges accumulated in the photodiode;
   a floating diffusion area formed on a second portion of the semiconductor substrate, on an opposite side of the transfer gate from the photodiode, to accommodate the optical charges; and
   a channel area formed under the transfer gate and contacting a side of the photodiode to transfer the optical charges;
   wherein the transfer gate is formed, at least in part, of transparent material, and
   wherein the transfer gate is formed of opaque material and the transparent material.

2. The image sensor of claim 1, wherein the optical charges accumulated in the photodiode are generated in the photodiode, in the channel area, or in the photodiode and the channel area.

3. The image sensor of claim 1, wherein the transparent material comprises one or more of a nitride comprising a Group 13 element from the Periodic Table of the Elements (PTOTE), an oxide comprising a Group 10 element from the PTOTE, an oxide comprising a Group 12 element from the PTOTE, a compound comprising a Group 12 element from the PTOTE and a Group 16 element from the PTOTE, ITO (indium tin oxide), and silica (SiC).

4. The image sensor of claim 3, wherein the nitride comprises one or more of Al, In, and Ga.

5. The image sensor of claim 3, wherein the nitride comprises one or more of GaN, AlGaN, InGaN, and AlInGaN.

6. The image sensor of claim 3, wherein the oxide comprises one or both of Zn and Ni.

7. The image sensor of claim 3, wherein the oxide comprises one or more of ZnO, NiO, and ZnAlGaO.

8. The image sensor of claim 3, wherein the compound comprises one or more of ZnSe, ZnTe, ZnS and CdS.

9. The image sensor of claim 1, wherein the transparent material is closer to the photodiode than the opaque material, and
   wherein the opaque material is closer to the floating diffusion area than the transparent material.

10. The image sensor of claim 9, wherein the opaque material comprises a single layer or multiple layers, and
    wherein the opaque material comprises one or more of amorphous polysilicon, doped polysilicon, polycrystalline silicon-germanium, and conductive metal.

11. The image sensor of claim 10, wherein the conductive metal comprises one or more of tungsten, molybdenum, and conductive metal nitride, and
    wherein the conductive metal nitride comprises one or more of titanium nitride, tantalum nitride, and tungsten nitride.

12. The image sensor of claim 1, wherein the transparent material is doped with dopant comprising one or more Group 3 elements from the Periodic Table of the Elements (PTOTE), one or more Group 5 elements from the PTOTE, or one or more Group 3 elements from the PTOTE and one or more Group 5 elements from the PTOTE.

13. A complementary metal-oxide-semiconductor image sensor, comprising:
   a semiconductor substrate;
   a photodiode formed on a first portion of the semiconductor substrate;
   a transfer gate formed on the semiconductor substrate, near the photodiode, to transfer optical charges accumulated in the photodiode;
   a floating diffusion area formed on a second portion of the semiconductor substrate, on an opposite side of the transfer gate from the photodiode, to accommodate the optical charges; and
   a channel area formed under the transfer gate and contacting a side of the photodiode to transfer the optical charges;
   wherein the transfer gate is formed, at least in part, of transparent material, and
   wherein the transparent material has higher sensitivity than polysilicon to light having a wavelength of about 500 nm.

14. The image sensor of claim 13, wherein the optical charges accumulated in the photodiode are generated in the photodiode, in the channel area, or in the photodiode and the channel area.

15. The image sensor of claim 13, wherein the transparent material comprises one or more of a nitride comprising a Group 13 element from the Periodic Table of the Elements (PTOTE), an oxide comprising a Group 10 element from the PTOTE, an oxide comprising a Group 12 element from the PTOTE, a compound comprising a Group 12 element from the PTOTE and a Group 16 element from the PTOTE, ITO (indium tin oxide), and silica (SiC).

16. The image sensor of claim 13, wherein the transparent material is doped with dopant comprising one or more Group 3 elements from the Periodic Table of the Elements (PTOTE), one or more Group 5 elements from the PTOTE, or one or more Group 3 elements and one or more Group 5 elements.

17. A method of manufacturing a complimentary metal-oxide-semiconductor image sensor, comprising:
   forming a photodiode on a first portion of a semiconductor substrate;
   forming a floating diffusion area on a second portion of the semiconductor substrate, separate from the photodiode; and
   forming a transfer gate on the semiconductor substrate, near the photodiode, to transfer optical charges accumulated in the photodiode;
   wherein the floating diffusion area accommodates the optical charges,
   wherein the transfer gate is formed, at least in part, of transparent material, and
   wherein forming the transfer gate comprises:
      forming a transparent transfer gate material and an opaque transfer gate material as a single layer, to a similar thickness, between the photodiode and the floating diffusion area, above the semiconductor substrate on which the photodiode and the floating diffusion area are formed;
      forming a photoresist pattern defining the transfer gate on the single layer; and
      etching the single layer in a shape of the photoresist pattern to produce the transfer gate.

18. The method of claim 17, wherein the transparent transfer gate material covers a portion of the photodiode.

19. The method of claim 17, further comprising:
   after forming the transparent gate transfer material, doping the transparent transfer gate material with dopant comprising one or more Group 3 elements from the Periodic Table of the Elements (PTOTE), one or more Group 5 elements from the PTOTE, or one or more Group 3 elements from the PTOTE and one or more Group 5 elements from the PTOTE.

20. The method of claim 18, further comprising:
   after forming the transparent transfer gate material, doping the transparent transfer gate material with dopant comprising one or more Group 3 elements from the Periodic Table of the Elements (PTOTE), one or more Group 5 elements from the PTOTE, or one or more Group 3 elements from the PTOTE and one or more Group 5 elements from the PTOTE.

* * * * *